United States Patent
Patzelt et al.

(10) Patent No.: US 11,152,856 B2
(45) Date of Patent: Oct. 19, 2021

(54) DEVICE FOR LIMITING A POWER LOSS DURING THE SAMPLING OF A DIGITAL SIGNAL

(71) Applicant: WAGO Verwaltungsgesellschaft mbH, Minden (DE)

(72) Inventors: Andreas Patzelt, Buende (DE); Christian Voss, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 16/738,734

(22) Filed: Jan. 9, 2020

(65) Prior Publication Data
US 2020/0220459 A1    Jul. 9, 2020

(30) Foreign Application Priority Data
Jan. 9, 2019 (DE) .................... 20 2019 100 080.5

(51) Int. Cl.
*H02M 3/157* (2006.01)
*G05F 3/26* (2006.01)
*H03K 17/60* (2006.01)

(52) U.S. Cl.
CPC ............ *H02M 3/157* (2013.01); *G05F 3/262* (2013.01); *H03K 17/60* (2013.01)

(58) Field of Classification Search
CPC ........ H02M 3/157; G05F 3/262; H03K 17/60; G11C 27/028
See application file for complete search history.

(56) References Cited

U.S. PATENT DOCUMENTS

| | | | |
|---|---|---|---|
| 5,410,269 | A | 4/1995 | Ohie et al. |
| 9,261,541 | B2 | 2/2016 | Maes et al. |
| 2008/0150590 | A1 | 1/2008 | Hsu |
| 2011/0002062 | A1 | 1/2011 | Fischer et al. |
| 2011/0032085 | A1* | 2/2011 | Maros ................. H05B 41/295 340/12.32 |
| 2013/0285667 | A1* | 10/2013 | Koduka ............. G01R 31/3835 324/433 |
| 2015/0318841 | A1 | 11/2015 | Meehan et al. |
| 2018/0076808 | A1 | 3/2018 | Singer |
| 2020/0052711 | A1* | 2/2020 | Barrenscheen ..... H03M 1/1295 |

FOREIGN PATENT DOCUMENTS

| | | |
|---|---|---|
| DE | 697 37 573 T2 | 3/2008 |
| EP | 2 890 001 A1 | 7/2015 |

* cited by examiner

*Primary Examiner* — Sibin Chen
(74) *Attorney, Agent, or Firm* — Muncy, Geissler, Olds & Lowe, P.C.

(57) ABSTRACT

A device for limiting a power loss during the sampling of a digital signal is illustrated. The device comprises a circuit disposed in the signal path of the digital signal, the circuit being configured to reduce a current flow along the signal path in response to a control signal which indicates a sampling pause.

12 Claims, 6 Drawing Sheets

DEVICE FOR LIMITING A POWER LOSS DURING THE SAMPLING OF A DIGITAL SIGNAL

This nonprovisional application claims priority under 35 U.S.C. § 119(a) to German Patent Application No. 20 2019 100 080.5, which was filed in Germany on Jan. 9, 2019, and which is herein incorporated by reference.

BACKGROUND OF THE INVENTION

Field of the Invention

The present invention relates to a device for limiting a power loss during the sampling of a digital signal.

Description of the Background Art

During the sampling of a digital signal, the voltage representing the digital signal or the current representing the digital signal is measured at certain points in time and assigned to a signal value representing a value range, for example a high level or a low level.

SUMMARY OF THE INVENTION

In this regard, the invention enlarges the technical knowledge in the form of devices according to the invention, which reduce the power loss during the sampling of a digital signal, in that the current flow along the signal path is reduced in sampling pauses.

For this purpose, a device according to the invention comprises a circuit disposed in the signal path of the digital signal, the circuit being configured to reduce a current flow along the signal path in response to a control signal which indicates a sampling pause.

The term "signal path," as used in the description and the claims, can be understood to be, in particular, an electrically conductive connection (during the sampling) between a circuit generating the digital signal (transmitter) and a circuit receiving the digital signal (receiver), via which the sampling is carried out. For example, the circuit may be connected upstream from a digital input and "passes on" the digital signal only if the signal present at the input is actually read in. In particular, the signal present at the input may be read in cyclically (for example controlled by a timer), so that (sampling) pauses, in which the signal is not read in, are present during the read-in points in time.

In addition, the term "control signal," used in the description and the claims, can be understood to be, in particular, an electrical signal, which controls, for example, an electronic component (e.g. a transistor), via which the circuit may be switched from a first mode, in which the digital signal is (essentially) "passed through," into a second mode, in which the current flow to the input is reduced. The control signal may have a first voltage, for example during the (sampling) pauses, and a second voltage at read-in points in time (which is, for example, higher than the first voltage).

In addition, the term "sampling," as used in the description and the claims, can be understood to be, in particular, a measurement and assignment of a digital signal to a signal value. In this connection, the term "sampling pause," as used in the description and the claims, can be understood to be, in particular, a period of time during which no measurement and assignment of a digital signal to a signal value is carried out, or during which the carried-out assignment does not continue to be used (.e. is ignored and overwritten from that point on).

The circuit preferably includes a current-limiting circuit, and the current-limiting circuit is varied by a switching element which is controlled by the control signal.

The current-limiting circuit preferably includes an input resistor, the current flow through the current-limiting circuit being limited by the input resistor for the purpose of reducing the power loss.

The digital signal preferably comprises current/voltage levels in a lower current/voltage level range and an upper current/voltage level range. The device is configured to generate a control signal which indicates a sampling pause when a sampling value is in the upper current/voltage level range and to not generate the control signal which indicates a sampling pause when a sampling value is in the lower current/voltage level range.

The device is preferably configured to sample the digital signal at certain points in time, to detect a sampling value and to generate the control signal which indicates a sampling pause when the sampling value is in the upper current/voltage level range, the current/voltage level range of the digital signal being reduced along the signal path during the sampling pause for the purpose of limiting the power loss by the device.

The current level of the digital signal is preferably reduced along the signal path during the sampling pause for the purpose of limiting the power loss by the device.

The device preferably further includes a microcontroller and a memory element and is configured to store a sampling value in the memory element in response to a request signal of the microcontroller and to indicate a sampling pause after the storage until the microcontroller generates a subsequent request signal.

The device is preferably configured to generate the control signal which indicates a sampling pause, when a sampling pause is indicated and the sampling value stored in the memory element corresponds to a high level.

The device preferably comprises a switching element, which switches an electrically conductive connection between the signal path and ground when the control signal which indicates a sampling pause is present at a control input of the switching element.

The device is preferably configured to generate a sampling value while the control signal is indicating the sampling pause and to determine whether the device is malfunctioning based on the sampling value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
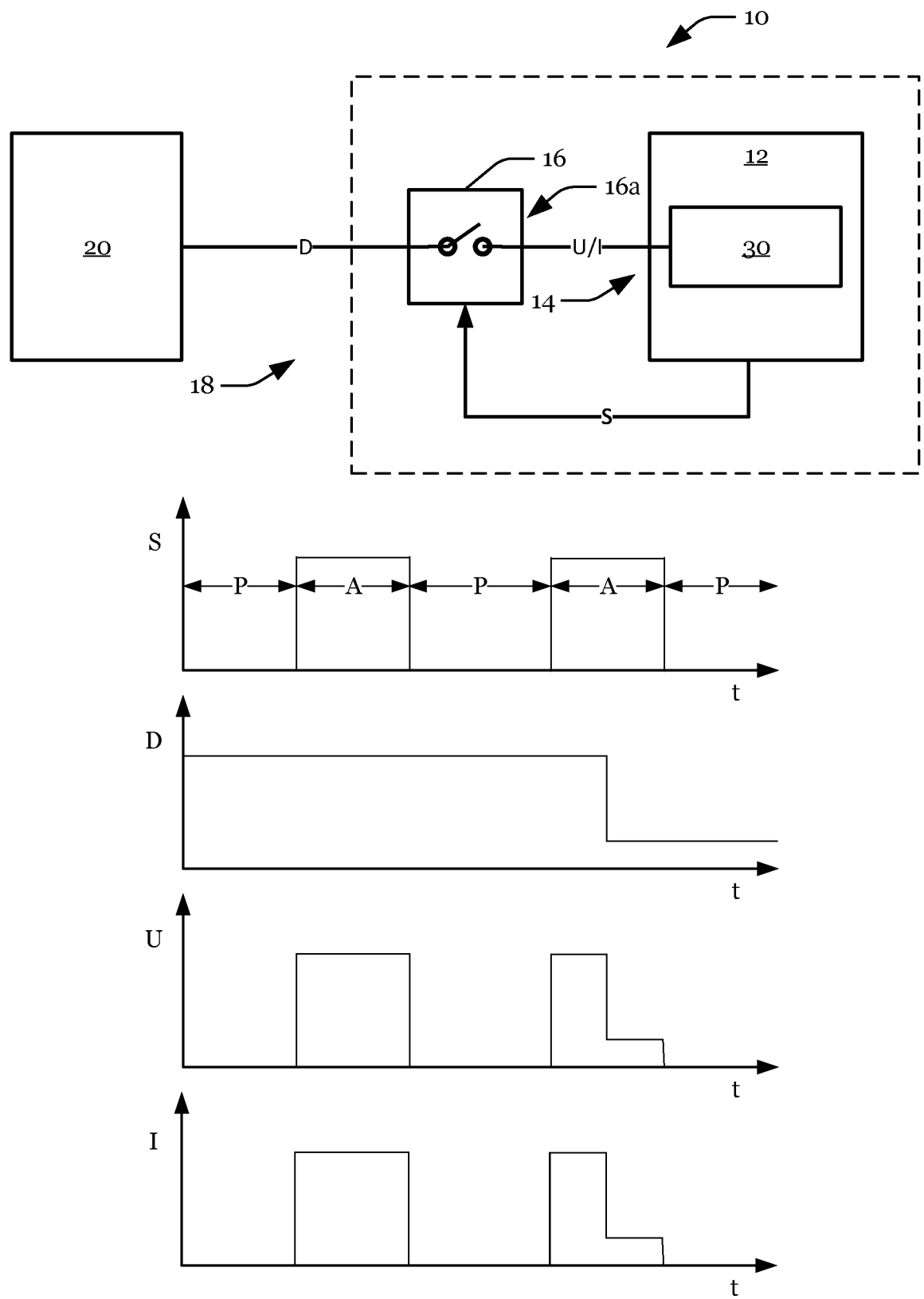
FIG. 1 shows a block diagram of a device according to the invention.

FIG. 1 shows a block diagram of a device 10 according to the invention. Device 10 comprises a receiver 12 (for example, a microcontroller) and a circuit 16 connected upstream from an input 14 of receiver 12. Circuit 16 is configured to reduce a current flow I along signal path 18 in response to a control signal S of receiver 12 which indicates a sampling pause P, in that signal path 18 is interrupted with the aid of a switch 16a. The power loss may be reduced thereby when sampling a digital signal D, which is output by a transmitter 20.

Figure 2:
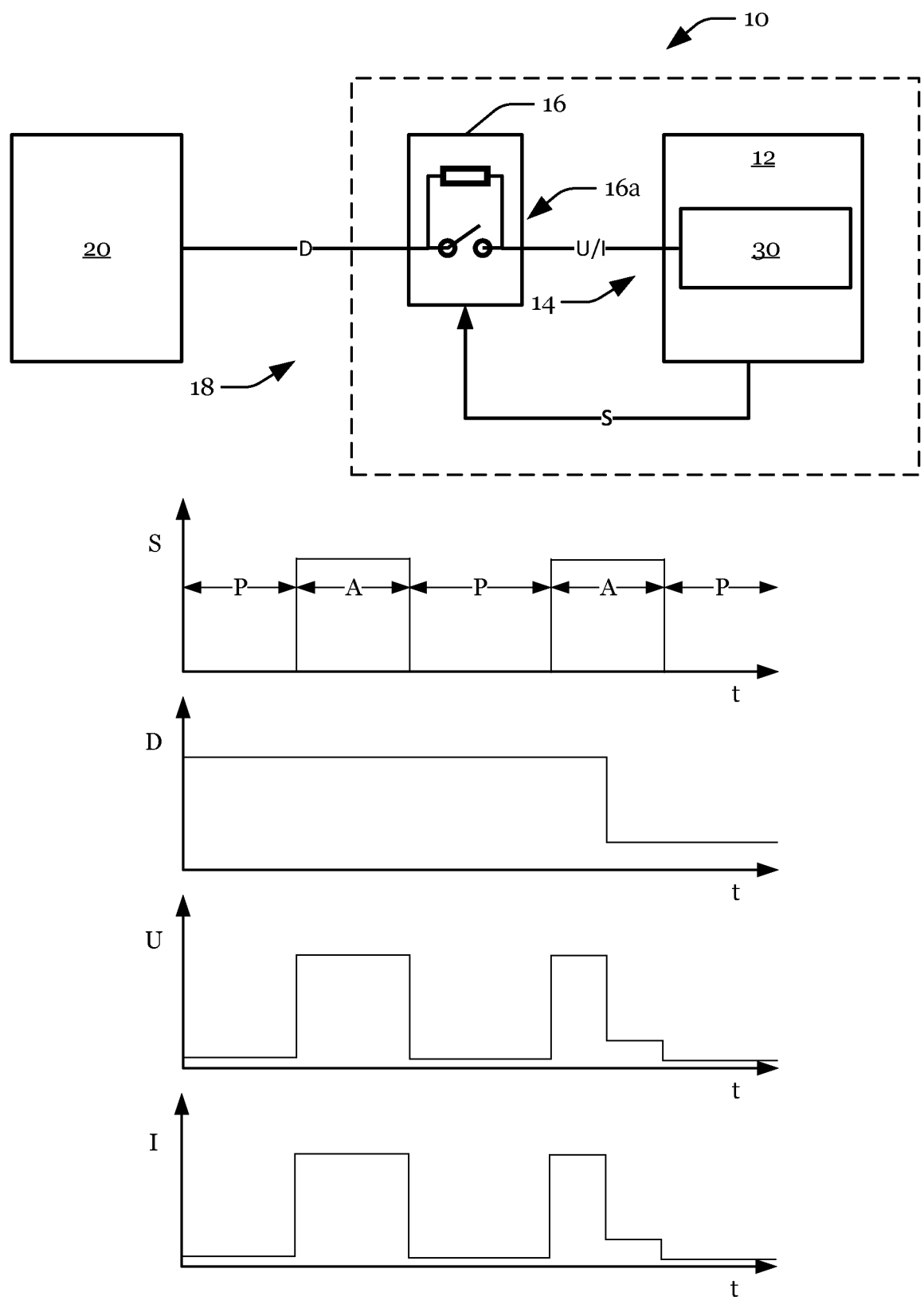
FIG. 2 shows a block diagram of another device according to the invention.

This procedure is advantageous, in particular when a deactivation of transmitter 20 (for example, a sensor) is not possible/sensible in sampling pauses P, for example because transmitter 20 requires a constant power supply to operate correctly. In addition, as shown in FIG. 2, a resistor is disposed in parallel to switch 16a, so that the current flow does not cease entirely even during sampling pauses P, and input 14 does not become de-energized even in sampling pauses P. The read-in sampling value may then be stored in a memory element 30 of receiver 12, memory element 30 being able to be overwritten with a new (instantaneous) value during each sampling operation. Receiver 12 may also read out and further process the sampling value from memory element 30 at any time.

Figure 3:
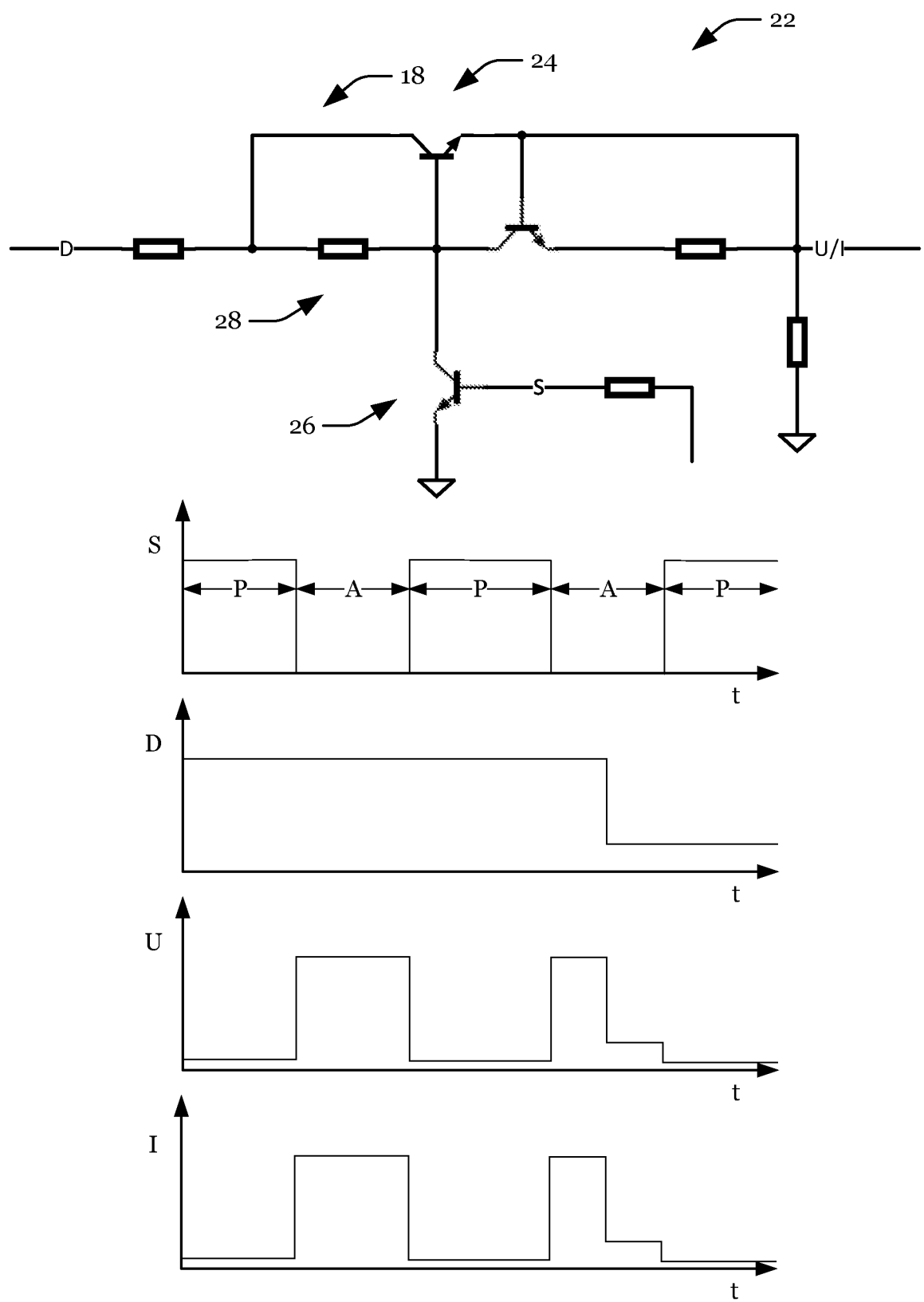
FIG. 3 shows a circuit diagram of a current-limiting circuit comprised in a device according to the invention.

FIG. 3 shows a circuit diagram of a possible embodiment of a current-limiting circuit 22 comprised in a device 10 according to the invention. Current-limiting circuit 22 includes a first transistor 24 placed in the signal path, which may be opened and closed with the aid of a control signal S. If a sufficiently high switching voltage is applied to a base of a second transistor 26, the latter becomes conductive, whereby the voltage present at the base of first transistor 24 is reduced. Due to the reduced base voltage, first transistor 24 becomes highly resistive, and current flow I trough first transistor 24 is reduced (sampling pause P).

However, if the voltage present at the base of second transistor 26 is reduced during a sampling phase A, second transistor 26 becomes highly resistive, whereby the voltage present at the base of first transistor 24 is increased. First transistor 24 becomes low-resistive thereby, and current flow I trough first transistor 24 is increased Current flow I which sets in through first transistor 24 may be adapted to input 14 of receiver 12 by dimensioning resistor 28. For example, an input voltage of 220 volts may thus be converted into an output voltage of 11 volts, whereby input 14 may be implemented with less powerful components.

Figure 4:
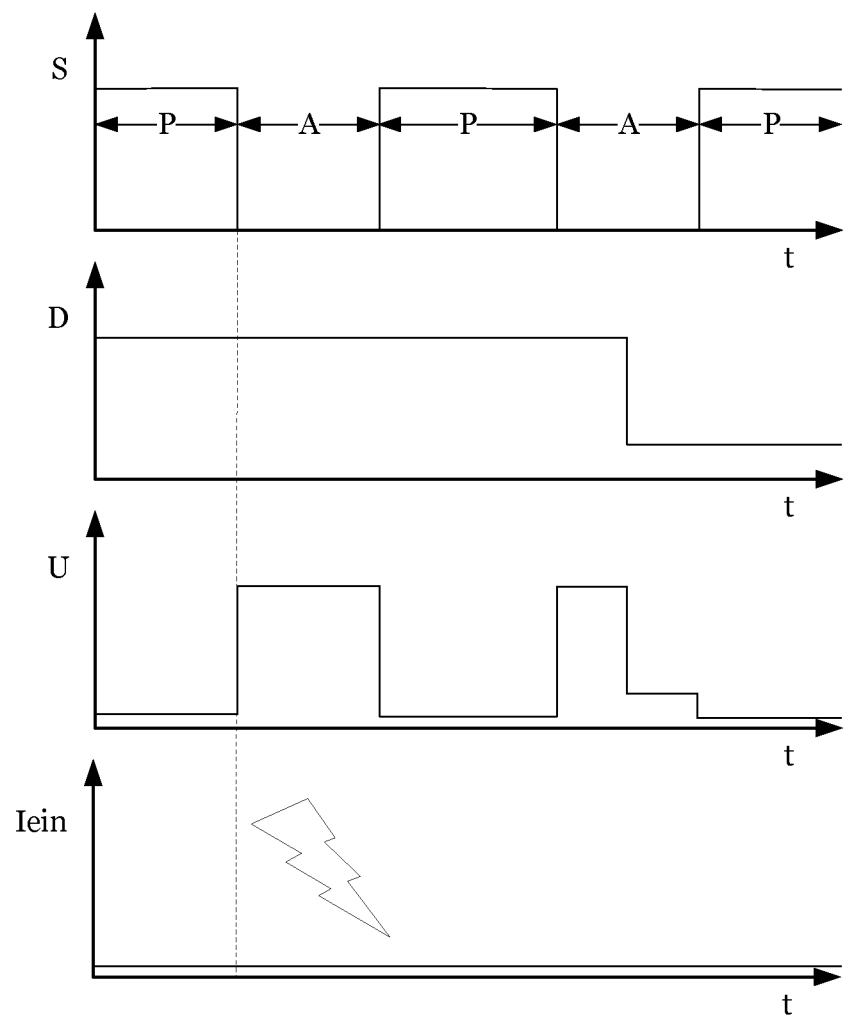
FIG. 4 shows a process for identifying faults.

In addition, as illustrated in FIG. 4, steps may be taken to check whether input 14 of receiver 12 is operating correctly. For example, if no change in signal Iein read in by receiver 12 is apparent, despite the switching between sampling pauses P and sampling phases A, it may be concluded that input 14 of receiver 12 is not functioning correctly. This may be advantageous, in particular in the case of safety-oriented receivers 12.

Figure 5:
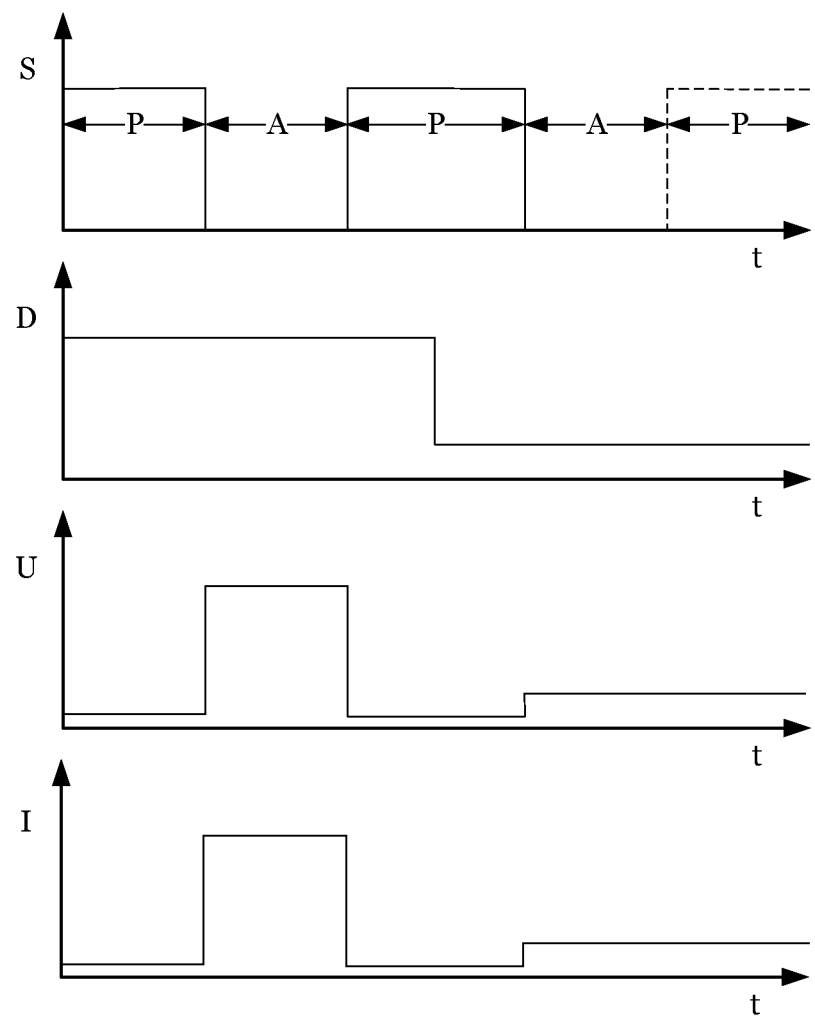
FIG. 5 shows a procedure for generating the control signal.
Figure 6:
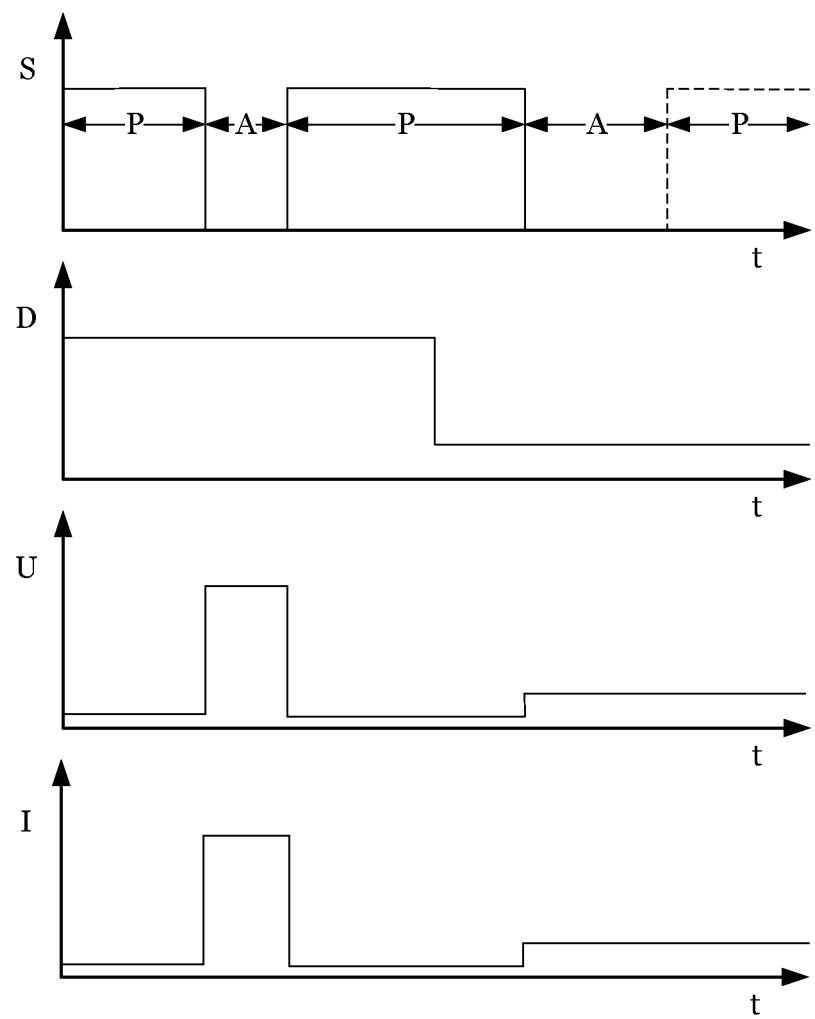
FIG. 6 shows another procedure for generating the control signal.

Moreover, as illustrated in FIG. 5, the indication of individual sampling pauses P (with the aid of control signal S) may be suppressed if sampling value Iein corresponds to a low level. The switching complexity may be reduced thereby without any significant increase in the power loss, since much less power loss occurs at a low level, in which the current/voltage level of digital signal D is in a lower current/voltage level range, than at a high level, in which the digital signal is in an upper current/voltage level range. In addition, as shown in FIG. 6, a sampling phase A may be immediately terminated if a high level has been read in and stored in memory 30 of receiver 12, whereby the power loss may be reduced even further.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for limiting a power loss during a sampling of a digital signal, the device comprising:
a circuit disposed in a signal path of the digital signal, the circuit being configured to reduce a current flow along the signal path in response to a control signal which indicates a sampling pause,
wherein the device generates the control signal based on at least one current or voltage level of the digital signal,
wherein the digital signal comprises current or voltage levels of the at least one current or voltage level in a lower current or voltage level range and in an upper current or voltage level range, and
wherein the device is configured to generate the control signal which indicates a sampling pause when a sampling value is in the upper current or voltage level range.

2. The device according to claim 1, wherein the circuit includes a current-limiting circuit, and power consumption of the current-limiting circuit is varied by a switching element, which is controlled by the control signal.

3. The device according to claim 2, wherein the current-limiting circuit includes an input resistor, and the current flow is limited by the current-limiting circuit to reduce the power loss through the input resistor.

4. The device according to claim 1, further comprising:
a microcontroller; and
a memory element,
wherein the device is configured to store the sampling value in the memory element in response to a request signal of the microcontroller and to indicate a sampling pause after the storage until the microcontroller generates a subsequent request signal.

5. The device according to claim 4, wherein the device is configured to generate the control signal which indicates a sampling pause when a sampling pause is indicated and the sampling value stored in the memory element corresponds to a high level.

6. The device according to claim 1, the device further comprising a switching element, which switches an electrically conductive connection between the signal path and ground when the control signal which indicates a sampling pause is present at a control input of the switching element.

7. The device according to claim 6, wherein the switching element is in the circuit.

8. The device according to claim 1, wherein the device is configured to generate a sampling value while the control signal is indicating the sampling pause and to determine whether the device is malfunctioning, based on the sampling value.

9. A device for limiting a power loss during a sampling of a digital signal, the device comprising:
   a circuit disposed in a signal path of the digital signal, the circuit being configured to reduce a current flow along the signal path in response to a control signal which indicates a sampling pause,
   wherein the digital signal comprises current/voltage levels in a lower current/voltage level range and in an upper current/voltage level range, and the device is configured to generate the control signal which indicates a sampling pause when a sampling value is in the upper current/voltage level range, and to not generate the control signal which indicates a sampling pause when a sampling value is in the lower current/voltage level range.

10. The device according to claim 9, wherein the device is configured to sample the digital signal at certain points in time, to detect a sampling value and generate the control signal which indicates a sampling pause when the sampling value is in the upper current/voltage level range, the current/voltage level range of the digital signal being reduced along the signal path during the sampling pause for the purpose of limiting the power loss by the device.

11. The device according to claim 10, wherein the current level of the digital signal is reduced along the signal path during the sampling pause to limit the power loss by the device.

12. A device for limiting a power loss during a sampling of a digital signal, the device comprising:
   a circuit disposed in a signal path of the digital signal, the circuit being configured to reduce a current flow along the signal path in response to a control signal which indicates a sampling pause,
   wherein the device generates the control signal based on at least one current or voltage level of the digital signal, and
   wherein the circuit includes a switching element and a resistor, the control signal opening or closing the switching element, the resistor providing a bypass for the switching element so that the current flow does not cease entirely even during the sampling pause.

* * * * *